US011152238B2

(12) United States Patent
Hu et al.

(10) Patent No.: US 11,152,238 B2
(45) Date of Patent: Oct. 19, 2021

(54) SEMICONDUCTOR PROCESSING STAGE PROFILER JIG

(71) Applicant: Taiwan Semiconductor Manufacturing Co., Ltd., Hsinchu (TW)

(72) Inventors: Cheng-Kang Hu, Kaohsiung (TW); Hsu-Shui Liu, Pingjhen (TW); Jiun-Rong Pai, Zhubei (TW); Shou-Wen Kuo, Hsinchu (TW); Sheng-Hsiang Chuang, Hsinchu (TW); Cheng-Hung Chen, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/201,312

(22) Filed: Nov. 27, 2018

(65) Prior Publication Data

US 2019/0164793 A1 May 30, 2019

Related U.S. Application Data

(60) Provisional application No. 62/592,691, filed on Nov. 30, 2017.

(51) Int. Cl.
*G05B 19/18* (2006.01)
*H01L 21/67* (2006.01)
*H01L 21/687* (2006.01)

(52) U.S. Cl.
CPC ...... *H01L 21/67288* (2013.01); *G05B 19/188* (2013.01); *H01L 21/68785* (2013.01); *G05B 2219/45031* (2013.01)

(58) Field of Classification Search
CPC ........ H01L 21/67288; H01L 21/68785; G05B 19/188; G05B 2219/45031; G03F 1/82; G03F 1/84; G03F 7/70783; G03F 7/70608; G03F 7/70616; G03F 7/70725; G03F 7/7085; G03F 7/7065; G01B 2210/56; G01B 15/08; G01B 11/30; G01B 11/306; G01N 21/9501; Y10S 269/00; Y10S 269/903; Y10S 414/135
See application file for complete search history.

(56) References Cited

U.S. PATENT DOCUMENTS

| 4,832,474 A * | 5/1989 | Yoshinaga | G02B 21/0016 359/392 |
| 5,255,089 A * | 10/1993 | Dybas | H04N 7/183 250/574 |
| 5,530,616 A * | 6/1996 | Kitabayashi | H01L 21/6831 361/234 |
| 5,978,078 A * | 11/1999 | Salamati-Saradh | G01N 21/94 356/141.1 |
| 6,601,310 B2 * | 8/2003 | Asanuma | G01B 5/0002 33/502 |
| 6,650,409 B1 * | 11/2003 | Noguchi | G01N 21/9501 356/237.3 |

(Continued)

FOREIGN PATENT DOCUMENTS

JP    11347756 A * 12/1999

*Primary Examiner* — M. N. Von Buhr
(74) *Attorney, Agent, or Firm* — Duane Morris LLP

(57) ABSTRACT

In an embodiment, a system includes a profiler configured to detect variations along a surface of a semiconductor stage; and a jig configured to move the profiler along an axis over the semiconductor stage.

20 Claims, 9 Drawing Sheets

(56) References Cited

U.S. PATENT DOCUMENTS

| | | | | |
|---|---|---|---|---|
| 7,295,314 B1* | 11/2007 | Spady | ............... | G01N 21/9501 |
| | | | | 356/237.1 |
| 9,257,316 B2* | 2/2016 | Okada | ................. | G01R 1/0408 |
| 10,490,463 B2* | 11/2019 | Lin | ..................... | G06K 9/2063 |
| 10,864,598 B2* | 12/2020 | Furuta | ................. | B23K 26/046 |
| 2006/0092419 A1* | 5/2006 | Gui | ..................... | G03F 7/70216 |
| | | | | 356/401 |
| 2007/0097341 A1* | 5/2007 | Hikima | ............... | G03F 7/70558 |
| | | | | 355/53 |
| 2015/0044947 A1* | 2/2015 | Lu | ........................ | B24B 37/044 |
| | | | | 451/41 |
| 2017/0350033 A1* | 12/2017 | Fujikata | ............ | H01L 21/67253 |
| 2018/0017594 A1* | 1/2018 | Tamura | .............. | G01R 1/06722 |
| 2018/0038008 A1* | 2/2018 | Mitsuya | .................. | H01L 22/00 |
| 2018/0040494 A1* | 2/2018 | Rebstock | ................ | H01L 22/12 |
| 2018/0061041 A1* | 3/2018 | Ahn | ..................... | H04N 5/2256 |
| 2019/0067057 A1* | 2/2019 | Hu | ..................... | H01L 21/67265 |
| 2019/0080944 A1* | 3/2019 | Sun | ..................... | H01L 21/6719 |
| 2019/0265276 A1* | 8/2019 | Ota | ........................ | G01R 31/28 |
| 2019/0304826 A1* | 10/2019 | Liu | ...................... | H01L 21/681 |

\* cited by examiner

SEMICONDUCTOR PROCESSING STAGE PROFILER JIG

CROSS-REFERENCE TO RELATED APPLICATION

The present application claims priority to U.S. Provisional Patent Application No. 62/592,691, filed on Nov. 30, 2017, which is incorporated by reference herein in its entirety.

BACKGROUND

Modern assembly line manufacturing processes are typically highly automated to manipulate materials and devices and create a finished product. Quality control processes often rely on human skill, knowledge and expertise for inspection of the manufactured product both during manufacture and as a finished product.

Current assembly line processes for processing semiconductor devices employ inspection techniques that rely on manual handling by one or more engineers and/or assembly line operators. These inspection techniques typically utilize sensors that are moved by hand to cover an area under investigation. Such techniques require large amounts of overhead and expensive hardware, but still fail to produce satisfactory results. Therefore, conventional inspection techniques are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1:
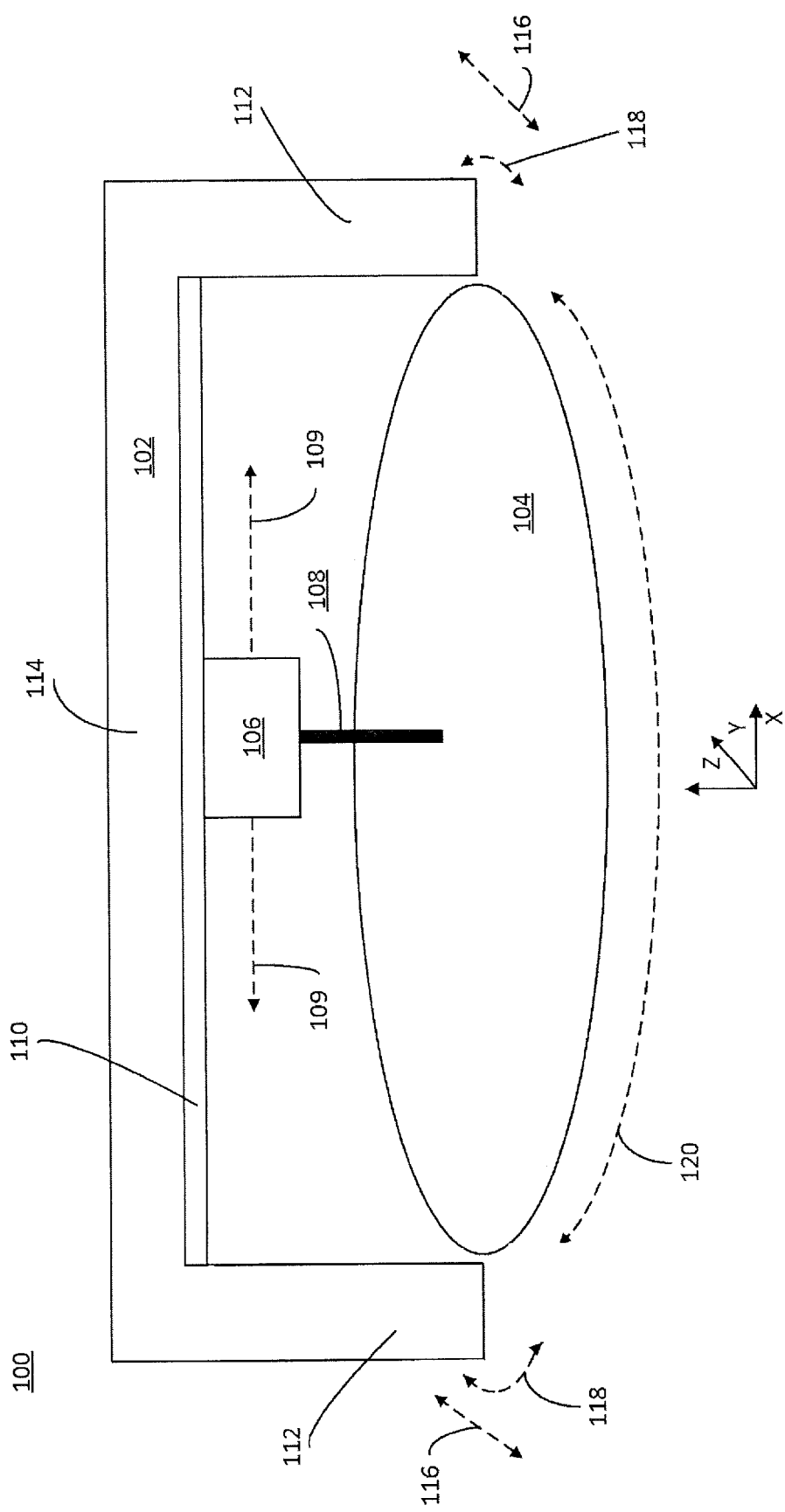
FIG. 1 is an illustration of a profiler jig relative to a semiconductor processing stage, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of profiler jig for semiconductor device processing. A profiler jig may be a structure configured to house and move a profiler over a semiconductor processing stage in an automated and controlled fashion. A profiler may be a sensor that detects for imperfections along a semiconductor processing stage. Examples of profilers include the Omron ZW-7000/5000 series confocal fiber displacement sensor manufactured Omron Corporation based in Kyoto, Japan and the Keyence LR-ZB100C3P distance based laser sensor manufactured by Keyence Corporation based in Osaka, Japan. A semiconductor processing stage may be any stage or platform on which a semiconductor device may be processed. Semiconductor processing, or fabrication, is the process used to create semiconductor devices, such as an integrated circuit (IC). Semiconductor processing may include multiple sequence steps of photo lithographic and chemical processing during which electronic circuits are gradually created on a wafer made of pure semiconducting material. Accordingly, the various sequence steps of photo lithographic and chemical processing during semiconductor processing may be performed on a semiconductor processing stage. However, as the semiconductor processing stage is the stage, or platform, on which semiconductor devices are processed or fabricated, it may be desirable that the top surface of the semiconductor processing stage be entirely uniform and without imperfections. This may avoid any non-uniformity or imperfection of the semiconductor processing stage being translated into a non-uniformity or imperfection on a semiconductor device processed atop the semiconductor processing stage.

Typically, inspections of semiconductor processing stages are carried out in a manual fashion. For example, in order to inspect the stage, the stage may be disassembled from a larger semiconductor processing system and transported to a profiler for inspection. Disassembly of the stage from the larger semiconductor processing system that the stage is part of may be undesirable. For example, such manual disassembly may be resource intensive, and risks damage to the semiconductor processing stage while in transit. Alternatively, a profiler may be brought to a stage but, without a profiler jig in accordance with various embodiments, the profiler may use manual handling for movement in order to inspect a semiconductor processing stage. Also, manual handing of a profiler does not provide the precision and accuracy that a profiler jig may provide, as discussed further below. Furthermore, semiconductor processing stages and larger semiconductor processing systems may not be designed for integration of quality control or inspection techniques but rather designed purely for the implementation of semiconductor processing.

Accordingly, semiconductor processing stage profiler jigs may advantageously be at a size that may be easily transported and operated atop standard semiconductor processing stages and larger semiconductor processing systems. For example, the profiler jig may be designed to sit atop standard designs for semiconductor processing stages without modification of the semiconductor processing stage or larger semiconductor processing systems. Also, the profiler jig may feature automated movement and control of a profiler which provides for increased repeatability and precision relative to manual movement. Furthermore, profiler jigs, when combined with standard semiconductor stage processing form factors and processes, may inspect the entire surface (or substantially the entire surface) of a semiconductor processing stage in an automated fashion and at greater precision and lower overhead than traditional manual systems.

Profiler jigs may also be advantageous relative to general purpose quality control systems as profiler jigs may provide specialized quality control for semiconductor processing without the extraneous bulk of other off-the-shelf solutions not specific for semiconductor processing. For example, profiler jigs may move a profiler along only a single axis. Profiler jig movement only along a single axis may take advantage of standard movement capabilities of some standard semiconductor processing stages (e.g., standard rotational capabilities of a semiconductor processing stage) without needing to integrate such movement capabilities additionally into the structure of the profiler jig. These types of profiler jigs may also be simpler to operate, cheaper to manufacture, and less prone to failures relative to more complex quality control systems that include movement of a profiler along more than one axis. Also, by moving only in a single axis, useful parameters such as surface uniformity (e.g., whether there is a gradient or depression across a semiconductor processing stage) may be determined without need for other extraneous, unnecessary features that may be present in non-specialized quality control systems.

Although a profiler jig may be described herein in relation to specific examples of semiconductor processing, various embodiments in accordance with the present disclosure may provide for a profiler jig that deploys a profiler for inspection during other types of quality control for different applications. For example, various embodiments in accordance with this disclosure may be applied to inspect processed (e.g., finished) semiconductor devices for uniformity with each other.

FIG. 1 is an illustration 100 of a profiler jig 102 relative to a semiconductor processing stage 104, in accordance with some embodiments. A profiler 106 may be mounted (e.g. fixed) in the profiler jig 102 and configured to profile (e.g., detect imperfections) along the surface of the semiconductor processing stage 104. By profiling, the profiler 106 may collect profiler data that characterizes the surface of the semiconductor processing stage 104 (as well as any imperfections detected across the semiconductor processing stage 104). For example, the profiler 106 may include a laser sensor that emits a laser 108 and measures aspects of the reflected beams of the laser 108 to determine parameters such as distance to surface, surface uniformity, surface flatness, surface coloration, material types (glass, metal, plastic, etc.), shapes (round, flat, uneven, etc.), and the like. Values associated with each of these parameters may be stored as parameter values, or profiler data, as will be discussed further below. The profiler jig 102 may be a structure configured to orient and move the profiler 106 relative to the semiconductor processing stage 104 so as to characterize the semiconductor processing stage 104 and detect imperfections along the semiconductor processing stage 104, as will be discussed further below.

The profiler jig 102 may be configured to move the profiler 106 along a horizontal axis (e.g., an X or a Y axis that are both orthogonal to each other and to a Z axis or vertical axis). The movement is illustrated as dotted line arrows 109 along a first horizontal axis (e.g., X axis). The movement of the profiler 106 by the profiler jig 102 may be a controlled movement (e.g., controlled using automated mechanical apparatuses capable of precise and repeatable motions). In certain embodiments, the profiler jig 102 may include a track 110 along which the profiler may be moved relative to both the profiler jig 102 and an underlying semiconductor processing stage 104. The profiler jig may include legs 112 extending along the vertical axis (e.g., a Z axis) and be connected by a bridge 114 that also supports the track 110. The bridge may be suspended above the semiconductor processing stage 104 so that the profiler 106 may move along and be supported by the track 110 above the semiconductor processing stage. Also, the profiler jig 102 may be configured such that the profiler 106 may be operable to examine the semiconductor processing stage 104 while the profiler jig 102 is moving the profiler 106 or (alternatively) not moving the profiler 106. Accordingly, the legs 112 may stand on any surface that allows for the profiler 106 to examine the underlying semiconductor processing stage 104 while the profile jig 102 is controlling movement of the profiler 106. For example, the legs may stand on a base, as will be illustrated further below, that surrounds the an area for the semiconductor processing stage. As a further example, the legs may stand on a floor, ground, or solid surface adjacent to the semiconductor processing stage 104 or may be attached to the base that surrounds the semiconductor processing stage 104.

A combination of the profiler jig 102 with movement control of the semiconductor processing stage 104 may be termed as a profiler jig system. The profiler jig system may control both movement of the profiler jig 102 (e.g., movement of the profiler 106 along one dimension, or axis) and movement of the semiconductor processing stage 104 (e.g., rotation of the semiconductor processing stage 104). As will be discussed further below the profiler jig system may perform a profiler jig review process that controls movement of both the semiconductor processing stage 104 and the profiler jig 102.

Stated another way, a combination of the profiler jig 102 with movement control of the semiconductor processing stage 104 may be termed as a profiler jig system. Accordingly, the profiler jig review process that controls movement of both the semiconductor processing stage 104 and the profiler jig 102 may refer to controlling movement of components of the profiler jig system.

In certain embodiments, the profiler jig 102, by itself, may perform a profiler jig review process that controls movement of the profiler jig 102 and not the semiconductor processing stage 104. Accordingly, control of the semiconductor processing stage 104 may be optional for performing a profiler jig review process.

In certain embodiments, the profiler jig 102 may also be configured to move the profiler 106 along more than a single axis. For example, the profiler jig 102 may be configured to move the profiler 106 along a second horizontal axis (e.g., the Y axis) orthogonal to the first horizontal axis along the track 110 via jig rotation. This is illustrated with dotted line arrows 116 along the second horizontal axis. Also, as another example, the profiler jig 102 may be configured to rotate around the vertical axis (e.g., Z axis), and thus also rotate the profiler 106 around a vertical axis. This rotation is illustrated with dotted line arrows 118. Accordingly, the profiler jig may be positioned in a variety of positions over a semiconductor processing stage in more than a single dimension.

In particular embodiments, the semiconductor processing stage 104 may be configured to move relative to the profiler jig 102 and/or the profiler 106. For example, the semiconductor processing stage 104 may be configured to rotate along a vertical axis (e.g., Z axis) while the profiler 106 is configured to move along a horizontal axis (e.g., X axis). The term rotate, or rotation of a semiconductor processing stage may refer to rotation around a vertical axis at the center point of the semiconductor processing stage. The rotation is illustrated with dotted line arrows 120. Accordingly, the profiler 106 may be positioned in a variety of positions above the semiconductor processing stage 104 between the legs 112 along two dimensions (due to moving along an X axis and rotating around a Z axis). This configuration may be advantageous as certain semiconductor processing stages 104 may be typically designed to rotate. Therefore, the addition of the profiler jig 102 may be unobtrusive for the semiconductor processing stage 104 (and larger semiconductor processing system) while providing an apparatus for automated examination of an entire upper surface of the semiconductor processing stage 104 for imperfections across two dimensions.

Figure 2:
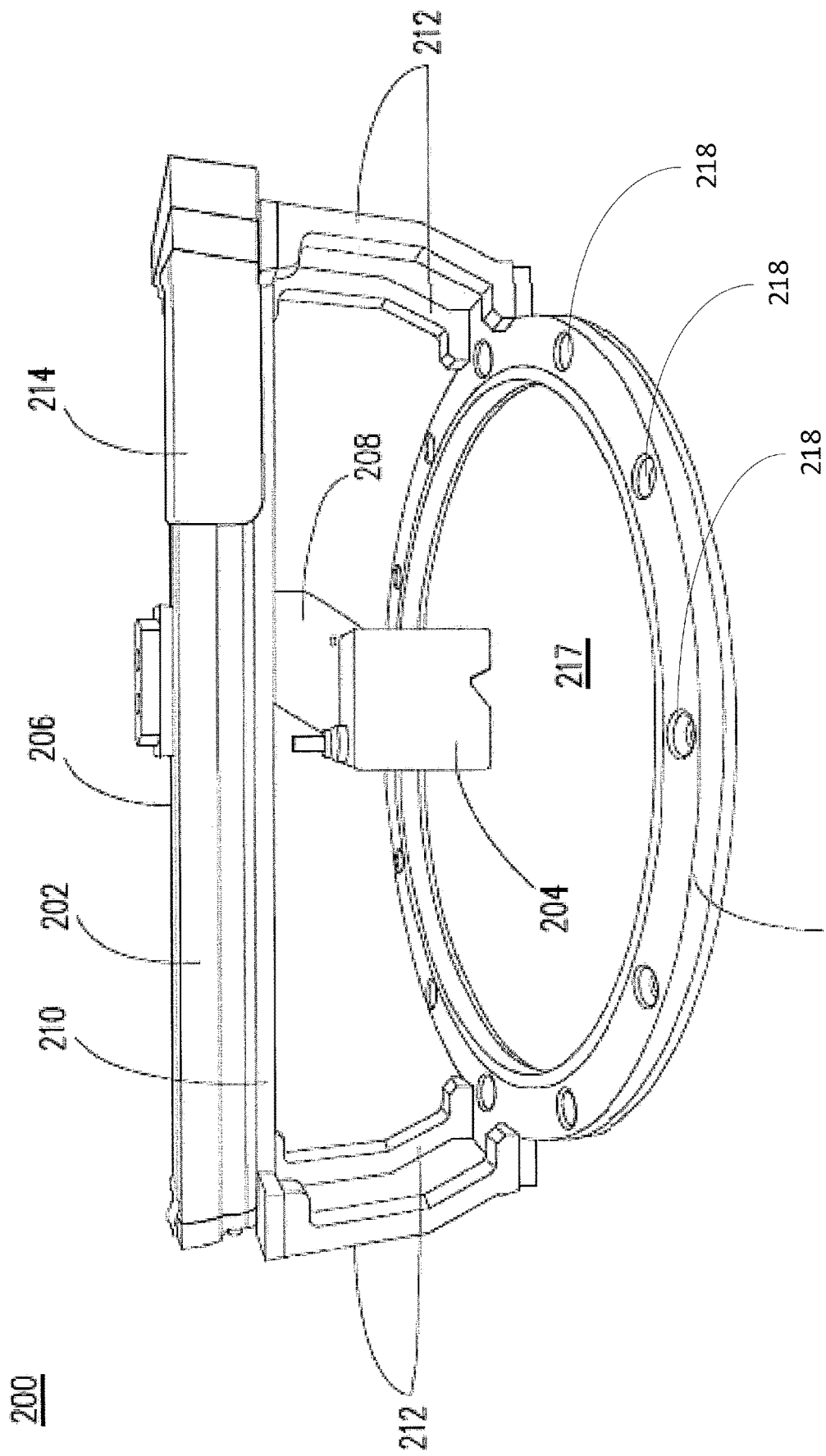
FIG. 2 is a computer assisted drawing of a profiler jig, in accordance with some embodiments.

FIG. 2 is a computer assisted drawing 200 of a profiler jig 202, in accordance with some embodiments. The computer assisted drawing 200 illustrates an embodiment of the profiler jig 202 different than the embodiment of FIG. 1. Returning to FIG. 2, the profiler jig 202 may include a profiler 204 that is attached to a track 206 of the profiler jig 202 via an attachment 208. The track 206 may be part of, or substantially form, a bridge 210 between the legs 212. The profiler 204 may be moved linearly along the track 206 using a controller 214 that controls the attachment 208 to move along the track 206 in controlled and precise motions. The profiler jig 202 may rest on (and not be formed as a single piece with, or be attached to) a base 216 that surrounds an area 217 for a semiconductor processing stage (not illustrated). The base 216 may be part of a larger semiconductor processing system. In certain embodiments, the base 216 may include various interface openings 218 within which a screw or other fastening device (not illustrated) may be utilized to fasten the base, permanently or temporarily, to the larger semiconductor processing system. The larger semiconductor processing system may be configured, or constructed, to receive the semiconductor processing stage in the area 217 and perform semiconductor processing on the semiconductor processing stage in the area 217.

In other embodiments, the base 216 may be part of the profiler jig 202 and be adhered to the profiler jig 202 (or, alternatively, the profiler jig 202 and the base 216 may be formed as one piece). Furthermore, by either resting on or being adhered to the base 216, the profiler jig 202 may be moved when the base 216 is moved (e.g., rotated) relative to a semiconductor processing stage that does not move along with the base 216. Accordingly, relative to the semiconductor processing stage, the profiler 204 on the profiler jig 202 may be moved along more than the single dimension (e.g., single axis) of the track 206 when the base is moved (e.g., rotated) relative to the semiconductor processing stage.

In many embodiments, the base 216 may be secured in either a permanent (non-removable) or temporarily (e.g., removable) manner to the larger semiconductor processing system. The larger semiconductor processing system may be configured, or constructed, to have the semiconductor processing stage in the area 217 and perform semiconductor processing on the semiconductor processing stage in the area 217. For example, the base 216 may generally surround the area 217 in which semiconductor processing may be performed on the semiconductor processing stage. By being surrounded, the base 216 may encompass a lateral perimeter of the area 217. In various embodiments, the base 216 may include the various interface openings 218 within which a screw or other fastening device (not illustrated) may be utilized to fasten the base 216 to the larger semiconductor processing system. For example, the screw or other fastening device (not illustrated) may include a head connected with a shaft. The shaft (e.g., a tip, thread, and shank of the screw) may pass through an interface opening 218 to interface with and screw into the larger semiconductor processing system. Also, the head may have a larger cross sectional area than the shaft so as not to fully pass through the interface opening and to secure the base 216 to the larger semiconductor processing system.

In particular embodiments, a calibration may be performed before the profiler 106 examines the underlying semiconductor processing stage within the area 217. This calibration may be, for example, a horizontal or vertical calibration to put the profiler 204 at a desired location relative to the semiconductor processing stage for the profiler 204 to examine the underlying semiconductor processing stage within the area 217. In particular embodiments, this may be a horizontal calibration to put the profiler 204 in a position over a part of the semiconductor processing stage to be examined.

Figure 3:
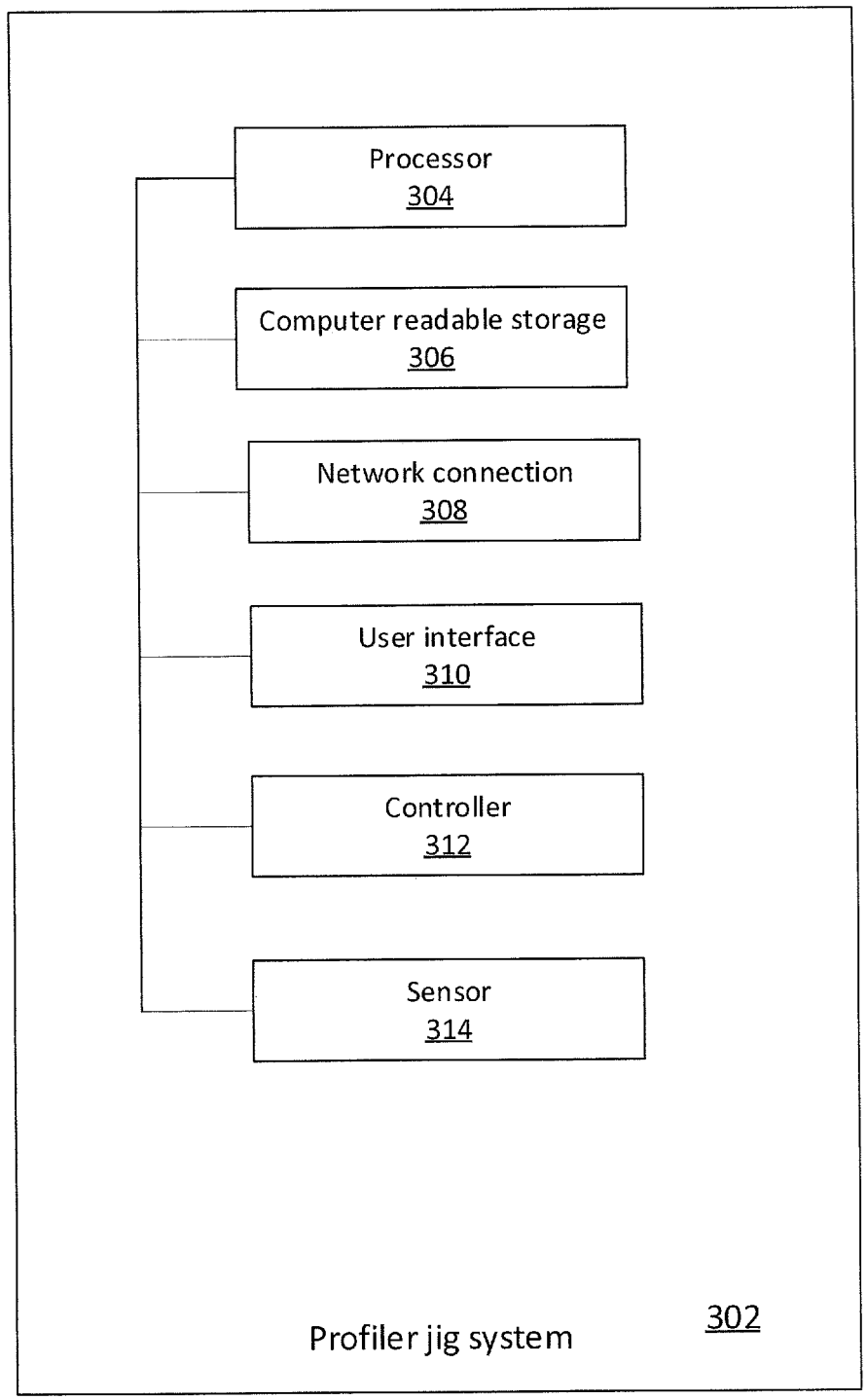
FIG. 3 is a block diagram of various functional modules of a profiler jig system, in accordance with some embodiments

FIG. 3 is a block diagram of various functional modules of a profiler jig system 302, in accordance with some embodiments. The profiler jig system 302 may include a processor 304. In further embodiments, the processor 304 may be implemented as one or more processors.

The processor 304 may be operatively connected to a computer readable storage module 306 (e.g., a memory and/or data store), a network connection module 308, a user interface module 310, a controller module 312 and a sensor module 314. In some embodiments, the computer readable storage module 306 may include profiler jig review process logic that may configure the processor 304 to perform a profiler jig review process. The computer readable storage may also store parameter data, such as profiler data, identifiers for a profiler and/or a semiconductor stage, a profiler data collection path, and any other parameter or information that may be utilized to perform defect offset correction.

The network connection module 308 may facilitate a network connection of the profiler jig system 302 with other devices that may communicate with the profiler jig system 302. In certain embodiments, the network connection module 308 may facilitate a physical connection, such as a line or a bus. In other embodiments, the network connection module 308 may facilitate a wireless connection, such as over a wireless local area network (WLAN) by using a transmitter, receiver, and/or transceiver.

The profiler jig system 302 may also include the user interface module 310. The user interface may include any type of interface for input and/or output to an operator of the profiler jig system 302, including, but not limited to, a monitor, a laptop computer, a tablet, or a mobile device, etc.

The profiler jig system 302 may include a controller module 312. The controller module 312 may be configured to control various physical apparatuses that control movement of a profiler and/or a semiconductor processing stage, as discussed above. For example, the controller module 312 may include a motor that moves the profiler along the track. Also, the controller module 312 may include a motor that moves the semiconductor processing stage (e.g., by rotating around a central vertical axis). The controller may be controlled by the processor and may carry out the various aspects of the profiler jig review process, as will be discussed further below.

The profiler jig system 302 may include a sensor module 314. The sensor module 314 may include the profiler, discussed further above. Accordingly, the profiler may interact with the processor 304 and/or other modules of the profiler jig system 302 to perform the profiler jig review process. The sensor module 314 may include various interfaces for the profiler so that the profiler may interact with the processor to carry out the profiler jig review process. In certain embodiments, the profiler may not be an integral part of the profiler jig, such that the profiler may be removably attached to the profiler jig.

Figure 4:
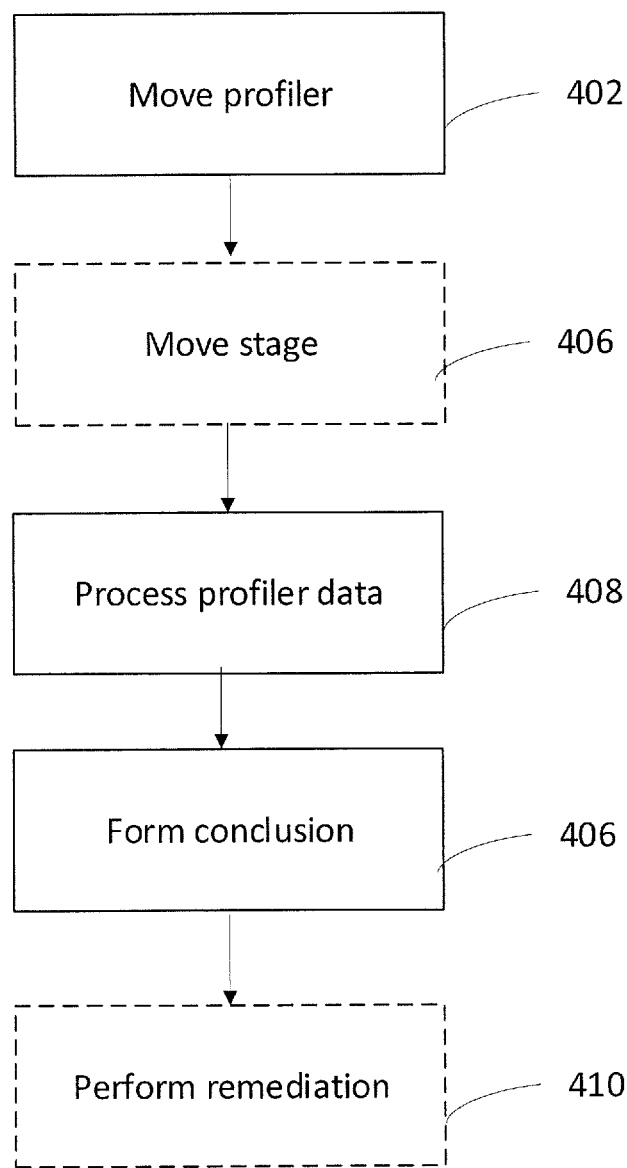
FIG. 4 is a flow chart of a profiler jig review process, in accordance with some embodiments.

FIG. 4 is a flow chart of a profiler jig review process 400, in accordance with some embodiments. The profiler jig review process may be performed by a profiler jig system or a profiler jig, both discussed above. It is noted that the process 400 is merely an example, and is not intended to limit the present disclosure. Accordingly, it is understood that additional operations may be provided before, during, and after the process 400 of FIG. 4, certain operations may be omitted, certain operations may be performed concurrently with other operations, and that some other operations may only be briefly described herein.

At operation 402, the profiler may be moved by the profiler jig. As discussed above, a profiler may be mounted in a profiler jig and moved along at least one axis along at least one track in the profiler jig. For example, the profiler jig may include a track along which the profiler may be moved along one axis (e.g., moved in one dimension).

At operation 406, as optionally noted with dotted lines, a semiconductor processing stage may be moved by the profiler jig system. In certain embodiments, the semiconductor processing stage may be moved independent of movement of the profiler by the profiler jig. In certain embodiments, the semiconductor processing stage may be moved by being rotated. As noted above, various operations may be performed simultaneously and/or in a different order. Therefore, in certain embodiments, operations 402 and 406 may be performed simultaneously, or operation 402 may be performed after operation 406, or operation 406 may be performed before operation 402. Operation 406 may be optional for embodiments that collect profiler data without moving the semiconductor processing stage.

At operation 408, profiler data collected by the profiler during and/or after performance of operations 402 and/or 406 may be processed. The data being collected may include values for parameters such as distance to surface, surface uniformity, surface flatness, surface coloration, material types (glass, metal, plastic, etc.), shapes (round, flat, uneven, etc.), and the like. The profiler data may be processed to provide aggregated information concerning a semiconductor processing stage, such as trends in variances (e.g., in height, smoothness, uniformity) across the surface of the semiconductor processing stage, as will be discussed further below.

At operation 408, the profiler data may be analyzed to produce a conclusion. The analysis may be in accordance with any type of analysis of the profiler data. As noted above, the data being collected may include values for parameters such as distance to surface, surface uniformity, surface flatness, surface coloration, material types (glass, metal, plastic, etc.), shapes (round, flat, uneven, etc.), and the like. Each of these parameters may be analyzed individually and/or in combination to determine whether there is a conclusion (e.g., a pass or a fail situation) based on the profiler data. For example, surface uniformity, or surface flatness in excess of a threshold characterization (e.g., a threshold value for one or more parameters) may indicate an error situation where the top surface of the semiconductor processing stage is not entirely uniform. This error situation may be undesirable as any non-uniformity or imperfection of the semiconductor processing stage may be translated into a non-uniformity or imperfection on a semiconductor device processed atop the semiconductor processing stage.

At operation 410, as optionally noted with dotted lines, a remediation may be triggered (e.g., performed) based on the conclusion of an error situation. For example, the conclusion that there is an error situation where the top surface of the semiconductor processing stage is not entirely uniform and without imperfections may provoke a refurbishing step where the semiconductor processing stage is replaced and/or fixed (e.g., processed) so that it is more uniform.

Figure 5:
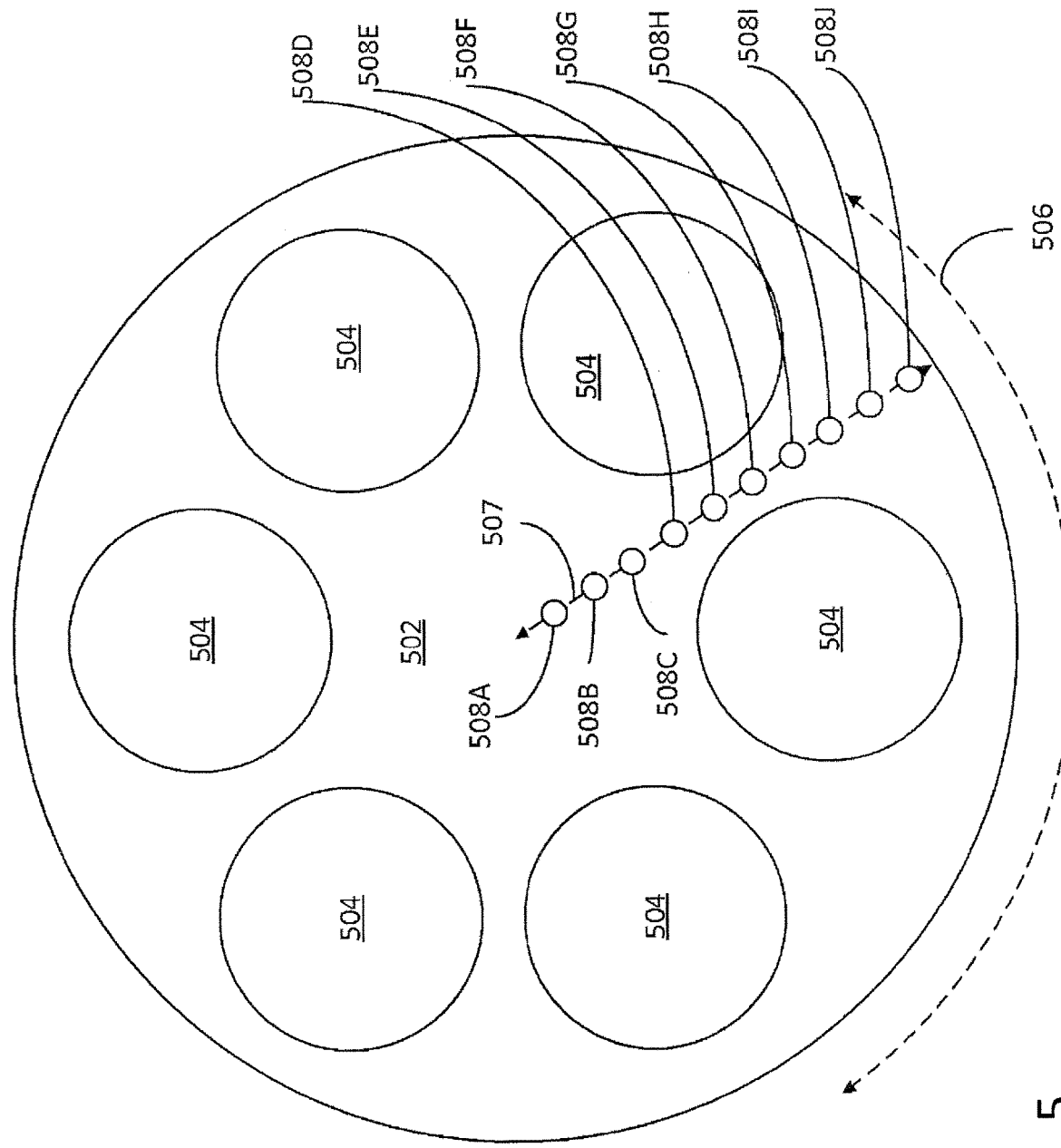
FIG. 5 is an illustration of various positions for a profiler jig relative to a semiconductor processing stage, in accordance with some embodiments.

FIG. 5 is an illustration of various positions for a profiler jig relative to a semiconductor processing stage 502, in accordance with some embodiments. The semiconductor processing stage may be shaped as a circle and include a number of semiconductor device receptacles 504 within which semiconductor devices may rest while undergoing semiconductor device processing. The semiconductor processing stage may also be configured to move (e.g., rotate), as indicated with a dotted line arrows 506.

The profiler jig may be configured to move the profiler to discrete positions along a radius of the semiconductor processing stage. These discrete positions may be equivalent to distances from a center point of the semiconductor processing stage (e.g., radius distance). For example, the profiler jig may be configured to move (as indicated by dotted line arrows 507) the profiler to discrete positions 508A-508J along the radius of the semiconductor processing stage. A radius may refer to a distance measured from a center point of the semiconductor processing stage 502. While at each discrete position 508A-508J, the semiconductor processing stage 502 may also be rotated by at least 360 degrees (e.g., a full rotation) in order for the profiler to collect profiler data at each of the positions 508A-508J along respective profiler data collection paths. A profiler data collection path may be an area on which the profiler may collect profiler data. Each of these respective profiler data collection paths may form concentric circles within the circumference of the semiconductor processing stage 502. Stated another way, the profiler jig may be configured to collect discrete sets of profiler data along each of the concentric circle profiler data collection paths at the discrete positions that the profiler jig may position the profiler at. Although FIG. 5 only illustrates ten discrete positions 508A-508J, the profiler jig may orient the profiler at any number of discrete positions along the radius of the semiconductor processing stage 502 for different applications in accordance with various embodiments. For example, the profiler jig may orient the profiler at 5 discrete positions or 15 discrete positions along the radius of a semiconductor processing stage 502.

Figure 6:
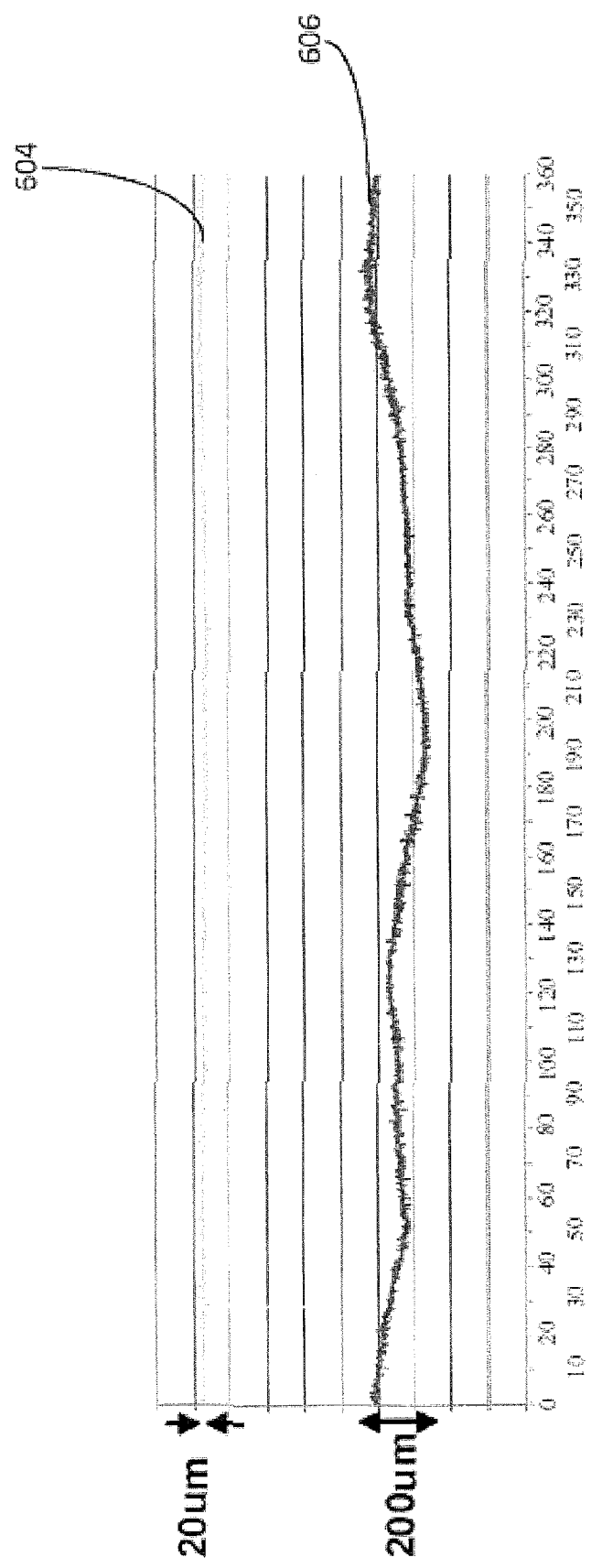
FIG. 6 is a graph of profiler data at two different discrete locations along the semiconductor processing stage of FIG. 5, in accordance with some embodiments.

FIG. 6 illustrates experimental results of variances in profiler data at two discrete positions across the semiconductor processing stage of FIG. 5, in accordance with some embodiments. The profiler data may include data produced by a profiler at a discrete location of a radius of 150 mm, represented by line 604. The profiler data may also include data produced by the profiler at a discrete location of a radius of 600 mm, represented by line 606. The profiler data may be plotted with height in micrometers (um) across angles of rotation in degrees (deg). As illustrated, the variance in height at the discrete location of 150 mm may be 20 um. This variance in height (e.g., 20 um) at the discrete location of 150 mm may be much less than the variance of 200 um at the discrete location of 600 mm. Also, the selected discrete locations may avoid (e.g., be outside of a profiler data collection path that traverses) the various receptacles 504 discussed above in connection with FIG. 5. Accordingly, FIG. 6 illustrates how a profiler may produce profiler data that characterizes height across different positions of a semiconductor processing stage. More specifically, the profiler data may indicate variances in height across these different positions. These variances in height may be utilized to determine whether there is an error situation (e.g., a significant non-uniformity beyond a threshold characterization).

Figure 7:
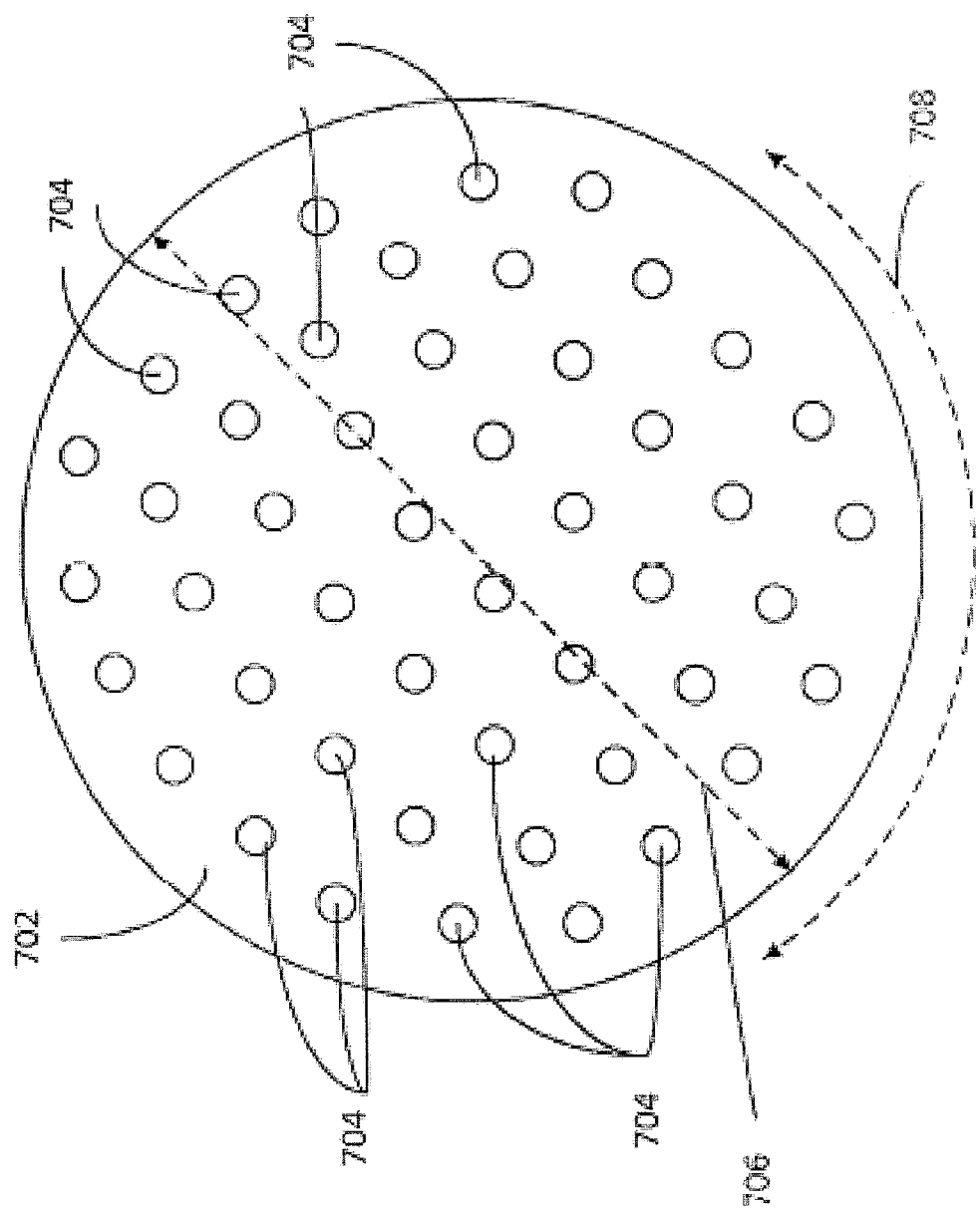
FIG. 7 is an illustration of an embossed semiconductor processing stage, in accordance with some embodiments.

FIG. 7 is an illustration of how a profiler jig may move a profiler relative to an embossed semiconductor processing stage 702, in accordance with some embodiments. The embossed semiconductor processing stage 702 may include multiple protrusions 704 across the semiconductor processing stage 702. Also, the semiconductor processing stage 702 may be configured (e.g., structured) to receive at least one semiconductor device for processing on the semiconductor processing stage 702. When a semiconductor device rests on the semiconductor processing stage 702, the protrusions 704 may space the resting semiconductor device from the bottom surface of the semiconductor processing stage (in contrast to an upper surface of the semiconductor processing stage atop the protrusions 704). Accordingly, the semiconductor device resting on the semiconductor processing stage may be more easily removable, as it does not lie flush with the semiconductor processing stage.

Relative to the semiconductor processing stage 702, the profiler jig may be configured to move the profiler along an axis in one dimension, such as along an axis that spans a diameter of the semiconductor processing stage 702. This movement is represented by the dotted line arrows 706 across the diameter of the semiconductor processing stage 702.

In certain embodiments, the semiconductor processing stage 702 may be configured to rotate. This rotational movement is indicated with dotted line arrows 708. However, in other embodiments, the semiconductor processing stage 702 may not be configured to rotate. Accordingly, the semiconductor processing stage 702 may be still while the profiler jig moves the profiler and/or while the profiler collects profile data.

Figure 8:
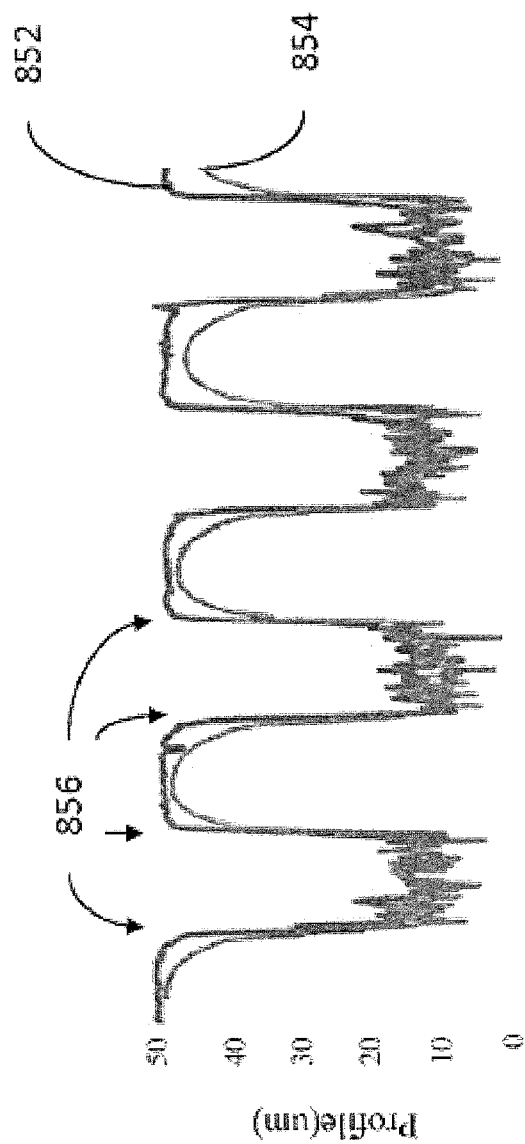
FIG. 8 is a graph of profiler data across new and worn protrusions in an embossed semiconductor processing stage, in accordance with some embodiments.

FIG. 8 illustrates experimental results of profiler data across new and worn protrusions in an embossed semiconductor, in accordance with some embodiments. The profiler data may be plotted as height (along a vertical axis) versus distance (along a horizontal axis). The actual dimensions of the distance along the horizontal axis is not important to an understanding of this embodiment and are omitted. The profiler data may reflect both new protrusions (represented by line 852) and worn (e.g., older) protrusions (represented by line 854). As illustrated, the lines 852 representing the new protrusions may have sharper edges 856 than the lines 854 representing the worn protrusions. Accordingly, the profiler data indicates that a profiler may be effective in determining when protrusions are new (represented by line 852) or whether they are worn (represented by line 854). As noted above, lack of surface uniformity (e.g., due to being worn) in excess of a threshold characterization (e.g., a threshold value for one or more parameters) may indicate an undesirable error situation. Accordingly, a remediation may be triggered (e.g., performed) based on the error situation. For example, the conclusion that there is an error situation where the semiconductor processing stage is not sufficiently uniform may provoke a refurbishing step where the semiconductor processing stage is replaced and/or fixed (e.g., processed) so that it is more uniform.

Figure 9:
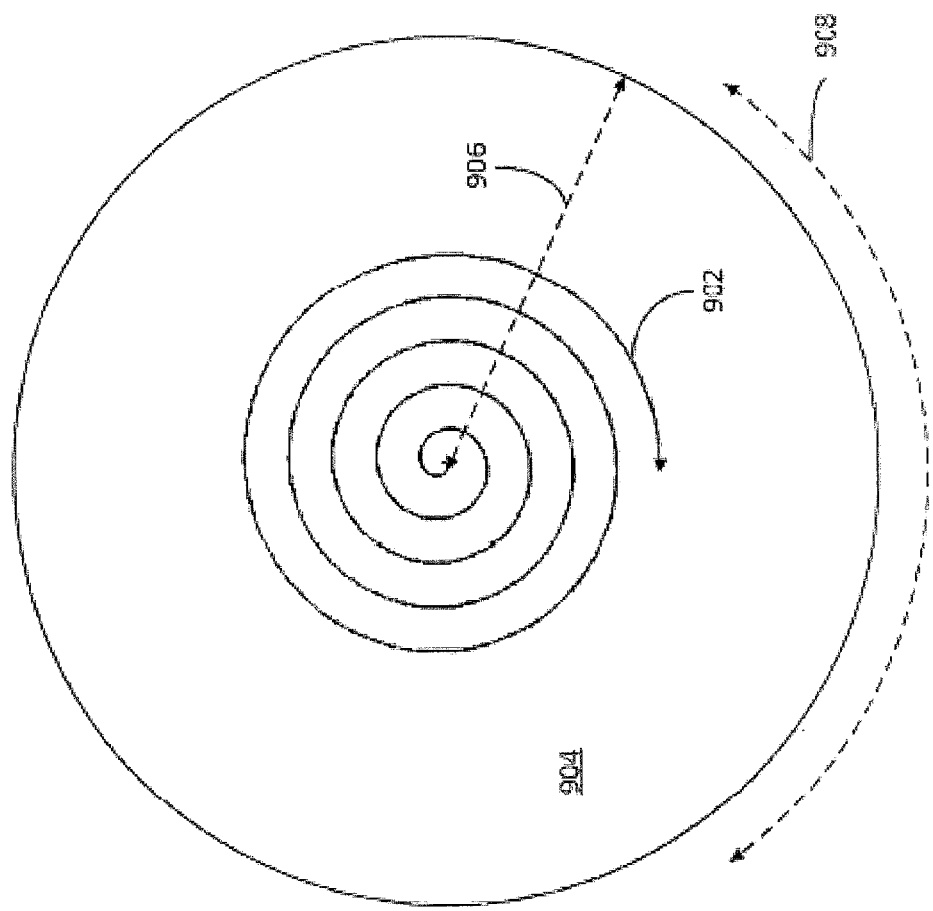
FIG. 9 is an illustration of a profiler data collection path arranged in a spiral pattern, in accordance with some embodiments.

FIG. 9 is an illustration of a profiler data collection path 902 in a spiral pattern, in accordance with some embodiments. The semiconductor processing stage 904 may be configured (e.g., structured) to receive at least one semiconductor device for processing on the semiconductor processing stage 904. Relative to the semiconductor processing stage 904, the profiler jig may be configured to move the profiler along a radius of the semiconductor processing stage 702. This movement is represented by the dotted line arrows 906 across the radius of the semiconductor processing stage 904. Also, the semiconductor processing stage 904 may be rotated while the profiler is moved along the radius of the semiconductor processing stage 904. The rotation may be represented by the dotted line arrows 908.

Accordingly, the profiler jig may continuously move the profiler along the radius (e.g., from the shortest radius position at the center of the semiconductor processing stage to the longest radius position away from the center of the semiconductor processing stage). This movement may occur while the semiconductor processing stage 904 is rotating, without stopping at any particular discrete location. The profiler may collect profiler data characterizing the semiconductor processing stage surface during this movement. The area on which the profiler may be collecting the profiler data may be a profiler data collection path 902. By varying the rotation of the semiconductor processing stage and the linear motion of the profiler by the profiler jig, the profiler data collection path 902 may be formed as a spiral across the surface of the semiconductor processing stage 904.

Profiler jigs as described above may be advantageous relative to general purpose quality control systems as profiler jigs may provide specialized quality control for semiconductor processing without the extraneous bulk of other off-the-shelf solutions not specific for semiconductor processing. For example, profiler jigs may move a profiler along only a single axis. Profiler jig movement only along a single axis may take advantage of standard movement capabilities of some standard semiconductor processing stages (e.g., standard rotational capabilities of a semiconductor processing stage) without needing to integrate such movement capabilities additionally into the structure of the profiler jig. These types of profiler jigs may also be simpler to operate, cheaper to manufacture, and less prone to failures relative to more complex quality control systems that include movement of a profiler along more than one axis. Also, by moving only in a single axis, useful parameters such as surface uniformity (e.g., whether there is a gradient or depression across a semiconductor processing stage) may be determined without need for other extraneous, unnecessary features that may be present in non-specialized quality control systems.

In some embodiments, a system includes a profiler configured to detect variations along a surface of a semiconductor stage; and a jig configured to move the profiler along an axis over the semiconductor stage.

In other embodiments, a system includes: a semiconductor stage, the semiconductor stage configured to receive a semiconductor device for processing, the semiconductor stage configured to rotate; a profiler, the profiler configured to detect variations along a surface of the semiconductor stage; and a jig comprising the profiler, the jig configured to move the profiler along an axis over the semiconductor stage.

In further embodiments, a method includes: loading a jig comprising a profiler over a semiconductor processing stage; moving the profiler using the jig along an axis over the semiconductor stage, the semiconductor stage configured to receive a semiconductor device for processing; detecting variations along a surface of the semiconductor stage using the profiler; collecting profiler data produced by the profiler, the profiler data characterizing the surface of the semiconductor stage; and performing a remediation to the semiconductor stage based on the profiler data.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A system, comprising:
    a profiler configured to detect surface contour variations of a top surface of a semiconductor stage, wherein the semiconductor stage is configured to hold a semiconductor wafer thereon; and
    a jig configured to move the profiler along an axis over the semiconductor stage, wherein the jig comprises:
        a base surrounding a perimeter of the semiconductor stage, wherein the base has an annular shape that surrounds an opening configured to receive the semiconductor stage therein, and the top surface of the semiconductor stage is visible through the opening to be detected by the profiler;
        two legs extending upwardly from the base on opposite sides of the base;
        a bridge connected to and extending between upper portions of the two legs; and
        a track disposed on the bridge, wherein the track is configured to move the profiler above the semiconductor stage, wherein the two legs, bridge and the track are fixedly coupled to the base.

2. The system of claim 1, wherein the semiconductor stage is configured to receive a semiconductor device for processing.

3. The system of claim 2, wherein the semiconductor stage is configured to rotate and the jig is configured to move the profiler while the semiconductor stage rotates.

4. The system of claim 2, wherein the jig is configured to move the profiler while the semiconductor stage is still.

5. The system of claim 1, further comprising a base that surrounds a semiconductor processing stage configured to receive a semiconductor device for processing.

6. The system of claim 1, wherein the jig is configured to rotate around the semiconductor stage.

7. The system of claim 1, wherein the semiconductor stage is configured to receive at least two semiconductor wafers for processing.

8. The system of claim 1, wherein the jig is detached from the semiconductor stage and configured to be moved over a second semiconductor stage.

9. The system of claim 1, wherein the jig is configured to move the profiler in an automated fashion.

10. A system, comprising:
    a semiconductor stage, the semiconductor stage configured to hold a semiconductor device thereon for processing, the semiconductor stage configured to rotate;
    a profiler, the profiler configured to detect surface contour variations of a top surface of the semiconductor stage; and
    a jig comprising the profiler, the jig configured to move the profiler along an axis over the semiconductor stage, wherein the jig comprises:
        a base surrounding a perimeter of the semiconductor stage, wherein the base has an annular shape that surrounds an opening configured to receive the semiconductor stage therein, and the top surface of the semiconductor stage is visible through the opening to be detected by the profiler;
        two legs extending upwardly from the base on opposite sides of the base;
        a bridge connected to and extending between upper portions of the two legs; and
        a track disposed on the bridge, wherein the track is configured to move the profiler above the semiconductor stage, wherein the two legs, bridge and the track are fixedly coupled to the base.

11. The system of claim 10, wherein the jig is configured to move the profiler while the semiconductor stage rotates.

12. The system of claim 10, wherein the jig is configured to move the profiler while the semiconductor stage is still.

13. The system of claim 10, wherein the jig is configured to move the profiler along at least one of: a radius of the semiconductor stage and a diameter of the semiconductor stage.

14. The system of claim 10, wherein the semiconductor stage is patterned with protrusions on which the semiconductor device rests.

15. The system of claim 10, wherein the jig is configured to rotate around the semiconductor stage.

16. A method, comprising:
providing a jig over a semiconductor processing stage, wherein the jig comprises:
- a base surrounding a perimeter of the semiconductor stage, wherein the base has an annular shape that surrounds an opening configured to receive the semiconductor stage therein;
- two legs extending upwardly from the base on opposite sides of the base;
- a bridge connected to and extending between upper portions of the two legs; and
- a track disposed on the bridge, wherein the two legs, bridge and the track are fixedly coupled to the base;

providing a profiler on the track, wherein a top surface of the semiconductor stage is visible through the opening to be detected by the profiler;
moving the profiler on the track along an axis over the semiconductor stage, the semiconductor stage configured to hold a semiconductor device thereon for processing;
detecting surface contour variations of the top surface of the semiconductor stage using the profiler;
collecting profiler data as the variations produced by the profiler, the profiler data characterizing the top surface of the semiconductor stage; and
performing a remediation to the semiconductor stage based on the profiler data.

17. The method of claim 16, wherein the semiconductor processing stage includes a plurality of semiconductor device receptacles within which a plurality of semiconductor devices, respectively, may rest while undergoing semiconductor device processing.

18. The method of claim 17, wherein data collected by the profiler provides aggregated information concerning variances in height, smoothness and uniformity across the surface of the semiconductor processing stage.

19. The method of claim 16, wherein data collected by the profiler includes at least one of surface flatness and surface coloration.

20. The method of claim 16, further comprising adapting the jig to a base that surrounds the semiconductor stage by the loading the jig above the base.

* * * * *